United States Patent
Leijten-Nowak (10) Patent No.: US 7,164,288 B2
(45) Date of Patent: Jan. 16, 2007

(54) ELECTRONIC CIRCUIT WITH ARRAY OF PROGRAMMABLE LOGIC CELLS

(75) Inventor: Katarzyna Leijten-Nowak, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 0 days.

(21) Appl. No.: 10/545,642

(22) PCT Filed: Feb. 12, 2004

(86) PCT No.: PCT/IB2004/050110

§ 371 (c)(1),
(2), (4) Date: Aug. 16, 2005

(87) PCT Pub. No.: WO2004/075410

PCT Pub. Date: Sep. 2, 2004

(65) Prior Publication Data

US 2006/0066345 A1   Mar. 30, 2006

(30) Foreign Application Priority Data

Feb. 19, 2003   (EP) ................................. 03100387

(51) Int. Cl.
*G06F 7/38*   (2006.01)
*H03K 19/173*   (2006.01)
*H03K 19/177*   (2006.01)

(52) U.S. Cl. ........................... 326/38; 326/41; 326/47; 708/230; 708/232; 708/235

(58) Field of Classification Search ............ 326/37–41, 326/47; 708/230, 232, 235
See application file for complete search history.

(56) References Cited

U.S. PATENT DOCUMENTS

| 5,570,039 | A | * | 10/1996 | Oswald et al. ................. 326/39 |
| 5,761,099 | A | * | 6/1998 | Pedersen ..................... 708/230 |
| 6,157,212 | A | * | 12/2000 | Lane ........................... 326/40 |
| 6,271,680 | B1 | * | 8/2001 | Mendel et al. ................. 326/40 |
| 6,288,570 | B1 | * | 9/2001 | New ............................ 326/41 |
| 2006/0097750 | A1 | * | 5/2006 | Leijten-Nowak ............. 326/39 |
| 2006/0164119 | A1 | * | 7/2006 | Nowak-Leijten ............. 326/41 |

\* cited by examiner

*Primary Examiner*—Rexford Barnie
*Assistant Examiner*—Jason Crawford (57) ABSTRACT

An electronic circuit has a programmable logic cell with a plurality of programmable logic units that are capable of being configured to operate in a multi-bit operand mode and a random logic mode. The programmable logic units are coupled in parallel between an input circuit and an output circuit. The input circuit can be configured to supply logic input signals from the same combination of the logic inputs to the programmable logic units in the random logic mode. In the multi-bit operand processing mode the input circuit is configured to supply logic input signals from different ones of the logic inputs to the programmable logic units. The programmable logic units are coupled to successive positions along a carry chain at least in the multi-bit operand mode, so as to process carry signals from the carry chain. The output circuit selects a first output signal OR from the programmable logic units under control of further input signals in the random logic mode and processes second outputs OD from the programmable logic units in parallel in the multi-bit operand mode. The output signal OR does not depend on the carry signal.

21 Claims, 8 Drawing Sheets

FIG. 1

PRIOR ART

ELECTRONIC CIRCUIT WITH ARRAY OF PROGRAMMABLE LOGIC CELLS

This application is a 371 of PCT/IB04/50109 filed on Feb.12, 2004.

The invention relates to an electronic circuit with an array of programmable logic cells.

Programmable logic cells enable circuit designers to adapt the logic function of individual instances of electronic circuits that have been mass-produced, such as integrated circuits. This reduces the time interval from design to production of a working circuit and it reduces manufacturing cost for production of small batches of products and for prototyping.

In one example of an implementation, a programmable cell contains a memory that is addressed by the input signal of the cell, the memory storing pre-programmed output signals for each combination of input signal values at the respective addresses that are addressed by these values. The memory is said to have a LUT (Look-Up Table) function, for looking up the output signals that are produced in response to various input signals.

Any logic function can be implemented with a LUT, provided that it contains sufficient memory space. In practice, however, only logic functions that require a limited number of inputs, typically no more than four, are implemented with LUTs in circuits with programmable logic cells. Such a LUT requires 16 memory locations. This permits the programming of random logic functions of four input bits. In many cases circuits with such cells with four input bit functions suffice. A circuit with an array of such cells, in which the outputs of cells are coupled to the inputs of other cells, permits the designer to implement more complicated logic functions.

Increasingly designers are implementing logic functions for which a part of the array of programmable logic cells is used to implement signal-processing operations such as additions. Many signal processing operations have the property that many bits of a wider input operand each can influence many bits in an output result, through carry effects. However, very inefficient implementations are obtained when such a wide dependency is implemented using 4 bit input LUTs.

Figure 1:
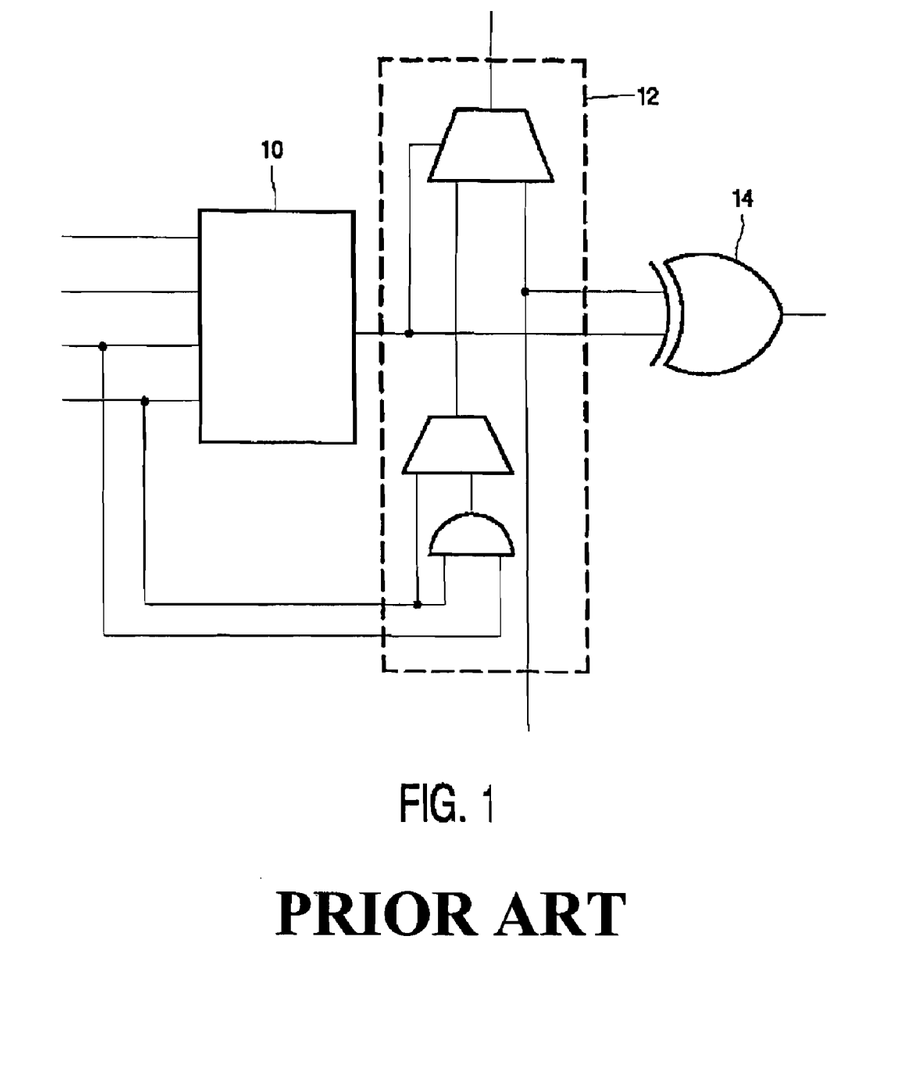
FIG. 1 shows a prior art programmable logic cell.

Xilinx™ has addressed this problem in its Virtex™ family of programmable logic devices by adding a carry chain to an array of 4 bit input LUT cells. FIG. 1 shows a programmable logic cell of such a device. The cell contains a four input lookup table 10 that performs the LUT function and a carry circuit 12 with a carry input and a carry output. The output of memory 10 is coupled to the carry circuit 12, which combines the carry input signal with the output signal of the LUT to form the carry output signal. An exclusive OR gate 14 is used to form the output signal of the cell from the carry input signal and output signal of the LUT. The carry input and carry output of the cell are coupled to the carry output and the carry input of adjacent cells in the array (not shown) to form a carry chain. The carry chain performs the carry function from the output of one 4 bit input LUT to another. As a result no LUTs need to be allocated to implement carry functions. This saves a considerable number of LUTs when the circuit is used to implement logic functions that include some signal processing operations.

Nevertheless, compared to dedicated signal processing circuitry, the implementation of signal processing functions in such a more general purpose circuit that is also capable of implementing random logic functions is still far less efficient. It would be desirable if this efficiency could be improved.

Among others, it is an object of the invention to provide an electronic circuit with an array of programmable logic cells which provide both random logic functions and signal processing operations, and in which the effects of carry dependency are reduced when providing random logic functions.

The electronic circuit according to the invention is set forth in Claim 1. The electronic circuit contains a programmable logic cell with a plurality of programmable logic units that are coupled in parallel between signal inputs and outputs of the cell. The programmable logic cell is configurable to operate in a random logic mode and in a multi-bit operand mode. The programmable logic units comprise a configurable look-up table circuit, having inputs coupled to receive the logic input signals from the input circuit and having an output, and a controllable inverter/non-inverter circuit, having an input connected to the output of the look-up table circuit, and being controllable by an input carry signal. The programmable logic units have a first output node connected to receive the output of the inverter/non-inverter circuit, and coupled to the output circuit for providing a multi-bit operand processing mode output signal, and a second output node connected to receive the output of the look-up table circuit, for providing a random logic mode output signal.

The provision of a dedicated output signal directly from the output of the look-up table has the advantage of removing the dependence on the carry signal, which is undesirable in the random logic mode. Furthermore, the invention also saves silicon area, and enables faster generation of random logic functions.

In an embodiment, the programmable logic unit further comprises a multiplexer, having inputs coupled to receive the logic input signals from the input circuit and having an output, the multiplexer receiving a control signal for determining which of the input signals is passed to the output of the multiplexer. This arrangement provides a programmable logic cell that has an improved multiplexing capability.

In a further embodiment, the programmable logic unit comprises a first auxiliary multiplexer having inputs coupled to receive the output of the inverter/non-inverter circuit and the output of the multiplexer, the output of the first auxiliary multiplexer being connected to the first output node, and a second auxiliary multiplexer having inputs coupled to receive the output of the look-up table circuit and the output of the multiplexer, the output of the second auxiliary multiplexer being connected to the second output node. The first and second auxiliary multiplexers provide output signals in accordance with configuration information. This arrangement reduces the number of output signals from the programmable logic unit.

These and other objects and advantageous aspects of the invention will be described using the following Figures.

Figure 2:
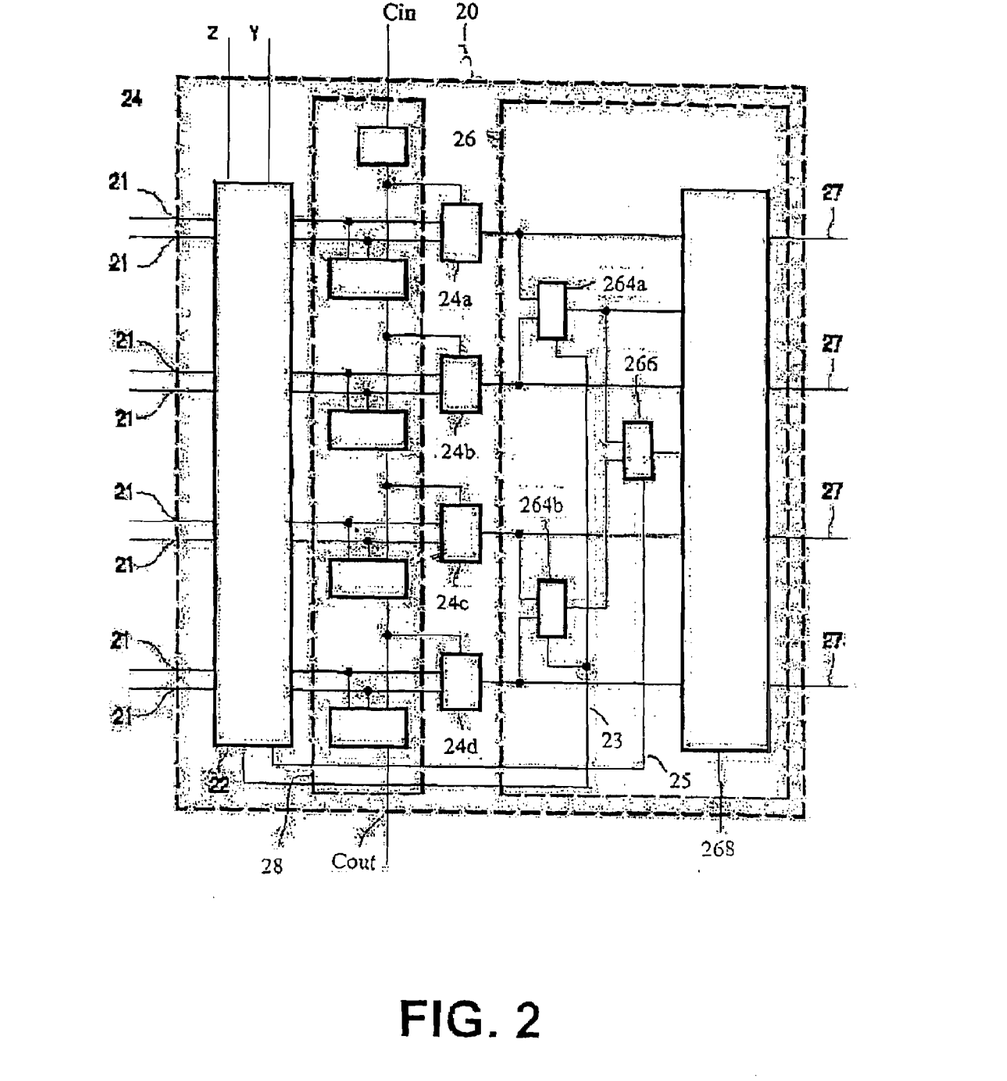
FIG. 2 shows a programmable logic cell which is configurable to function in a datapath mode and a random logic mode.

FIG. 2 shows a programmable logic cell 20 having an architecture which enables designers to implement random logic functions when operating in a random logic mode or multi-bit operand processing functions when operating in a multi-bit operand processing mode. Cell 20 contains an input circuit 22, a plurality of programmable logic units 24*a*–*d*, an output circuit 26 and a carry chain 28. Signal inputs 21 and signal outputs 27 of the cell 20 are coupled via a cascade of input circuit 22, a parallel arrangement of programmable logic units 24*a*–*d* and output circuit 26. Carry chain 28 has a carry input Cin and a carry output Cout and is coupled to the programmable logic units at a series of positions along the chain.

Output circuit 26 contains a number of stages of multi-plexers 264*a*, 264*b*, 266 and a switching stage 268. Control inputs 23 of the multiplexers 264*a*, 264*b* in the first stage are coupled to a respective output of input circuit 22. Signal inputs of the multiplexers 264*a*, 264*b* of the first stage are coupled to the outputs of pairs of programmable logic units 24*a*–*d*. Control input 25 of the multiplexer 266 in the second stage is coupled to a respective output of the input circuit 22. Signal inputs of the multiplexer 266 at the second stage are coupled to the outputs of the multiplexers 264*a*, 264*b* of the first stage. It is noted that although multiplexers 264*a*, 264*b* are shown as having a common control input 23, the circuit may be configured to provide separate control signals 23*a*, 23*b*. In addition, it will be appreciated that, although FIG. 2 shows only two stages of multiplexers 264*a*/264*b* and 266, further stages are possible, for example if the logic cell contains more than four logic cells 24*a*–*d*.

The outputs of the programmable logic units 24*a*–*d* and the multiplexer 266 of the second stage are coupled to inputs of the switching stage 268. Outputs of switching stage 268 are coupled to signal outputs 27 of cell 20. Switching stage 268 is configurable to couple either the outputs of the programmable logic units 24*a*–*d* to outputs 27 or the outputs of the multiplexers 264*a*, 264*b*, 266 of the first and second stage to outputs 27, or at least the output of multiplexer 266 of the second stage. Switching stage 268 may be provided with latches or flip-flops (not shown) for latching the output signal, so that cell 20 can function as a final part of a pipelined stage in a pipelined circuit. Preferably, switching stage 268 is configurable to pass either registered signals (i.e. using latches or flip-flops) or non-registered signals (i.e. direct signals).

By programming configuration bits of programmable logic units 24*a*–*d*, input circuit 22, output circuit 26 and carry chain 28, the function of cell 20 can be configured. (The configuration bits are stored in configuration memories (not shown) which are loaded via a programming path (not shown), both of which are known per se for programmable logic devices). The configuration bits determine which of signal inputs 21 are coupled to which of programmable logic units 24*a*–*d*, the configuration bits determine which output signal values the programmable logic units 24*a*–*d* will produce in response to various input signal values, the configuration bits determine which signals switching stage 268 will pass to signal output 27 and the configuration bits determine whether a carry input signal from carry input Cin will be passed into cell 20.

In operation cell 20 can be configured to function in a random logic mode and in a multi-bit operand processing mode. In operation, the multi-bit operand mode cell 20 outputs a plurality of bits of an output result that depends on input operands with a plurality of bits. The bits in each input operand have successively higher significance levels. In the multi-bit operand mode each programmable logic unit 24*a*–*d* is associated with a different significance level. The input circuit 22 is configured to pass signals to each programmable logic unit 24*a*–*d* that represent the bits from different operands, each bit corresponding to the significance level that is associated with the programmable logic unit 24*a*–*d*. Each programmable logic unit 24*a*–*d* responds to these signals by computing the bit of the result at the significance level that is associated with the programmable logic unit 24*a*–*d*, taking account of a carry in signal that is received from carry chain 28 from a lower significance level and supplying a carry out to the carry chain for use at a higher significance level. In the multi-bit operand mode, all programmable logic units 24*a*–*d* will generally be configured to provide the same relation between their input signals and output signals. Output circuit 26 is configured to pass the computed bits of the result from all of the programmable logic units 24*a*–*d* in parallel as output signals to output 27.

Carry chain 28 computes carry signals and passes these carry signals from one programmable logic unit 24*a*–*d* to another. The configuration of carry chain 28 controls whether carry chain 28 uses a carry input signal from carry input Cin to determine the carry signals. If cell 20 processes input signals that are more significant bits of a larger operand, the cell is configured so that such a carry input signal is used to receive a carry output signal of another cell that processes less significant operands.

In operation in the random logic mode the output signal of cell 20 is a random logic function of a number of input signals. This random logic function is implemented using programmable logic units 24*a*–*d* and the first and second stages of multiplexers 264*a*, 264*b*, 266. Input circuit 22 passes the same input signals to each of the programmable functional units 24*a*–*d*. Under control of other ones of the input signals which form first and second control signals 23, 25, the multiplexers 264*a*, 264*b*, 266 select one of the programmable logic units 24*a*–*d* from which the output signal is passed to switching stage 268. The first control signal 23 controls both multiplexers 264*a,b* in the first stage, while the second control signal 25 controls multiplexer 266 in the second stage, which selects between the outputs of multiplexers 264*a,b* in the first stage. Thus, a logic function is realized that depends both on the input signals of the programmable logic units 24*a*–*d* and on the other ones of the input signals, i.e. the control signals 23, 25 that control multiplexers 264*a*, 264*b*, 266. Each of the programmable functional units 24*a*–*d* produces an output signal in response to the same input signals, each for use as output signal for a different value of the other ones of the input signals forming the control signals 23, 25. Switching stage 268 passes the resulting output signal from multiplexer 266 to the signal output of cell 20.

It is noted that that signals 23, 25 may be derived either from the auxiliary signals Y and Z (which in turn may be shared with control signals SUB and MUL as described later in the application), or from the primary input signals 21, or a combination of both.

Carry chain 28 is configured so that no external carry input signal is used in the random logic mode. Dependent on the implementation of carry chain 28, carry chain 28 may still pass some carry signals, which arise at certain input values of the inputs to programmable logic units 24*a*–*d*. In this case, the configuration of programmable logic units 24a–d further down the carry chain may be adapted to account for the presence of carry signals for specific values of the input values. In an alternative implementation of carry chain 28, multiplexers may be included in the carry chain, which pass either the carry signal from a previous significance level in the multi-bit operand mode or a predetermined signal (e.g. zero for all significance levels) in the random logic mode. In this embodiment, the configuration of programmable logic units 24a–d need not be adapted to account for the presence of signal dependent carry signals. Further details of the carry chain are provided later in the description.

Thus, there is a contrast between the random logic mode and the multi-bit operand mode. On one hand, in the random logic mode, each programmable logic unit 24a–d receives the same input signals and each provides a potentially different input-output function for a different value of the other ones of the input signals that control the multiplexing stages 264a, 264b, 266. On the other hand, in the multi-bit operand mode, the programmable logic units 24a–d receive different input signals, but generally provide the same input-output function. The use of exclusive OR gate 402 to effect carry makes it possible to program both any random two-bit logic function and a signal processing operation that involves a carry with no more than four configuration bits in LUT unit 400.

By using the programmable logic units alternatively on one hand for implementing computation of different significance levels of a two multi-bit operand signal processing operation and on the other hand as part of a structure for computing a more than two bit-input random logic function, the number of configuration bits that is needed to support implementation of both random logic functions and multi-bit operand signal processing is minimized. However, in the example of FIG. 2, with four two input programmable logic units 24a–d, which are fully programmable with four configuration bits each, sixteen bits suffice to define any four bit-input random logic function and at the same time four significance levels of any two-operand signal processing operation. In contrast, consider the situation where four bit input programmable logic units 24a–d would have been used (each of which requires 16 configuration bits for full programming). When using 4-input logic units instead of 2-input logic units, two significance levels of multi-bit operand processing can be implemented if no dedicated carry signal is present, or four significance levels if such circuitry is present. In both cases, however, four 4-bit input logic units will require 64 configuration bits in total, i.e. four times the number of configuration bits required by the embodiment of FIG. 2.

Figure 3:
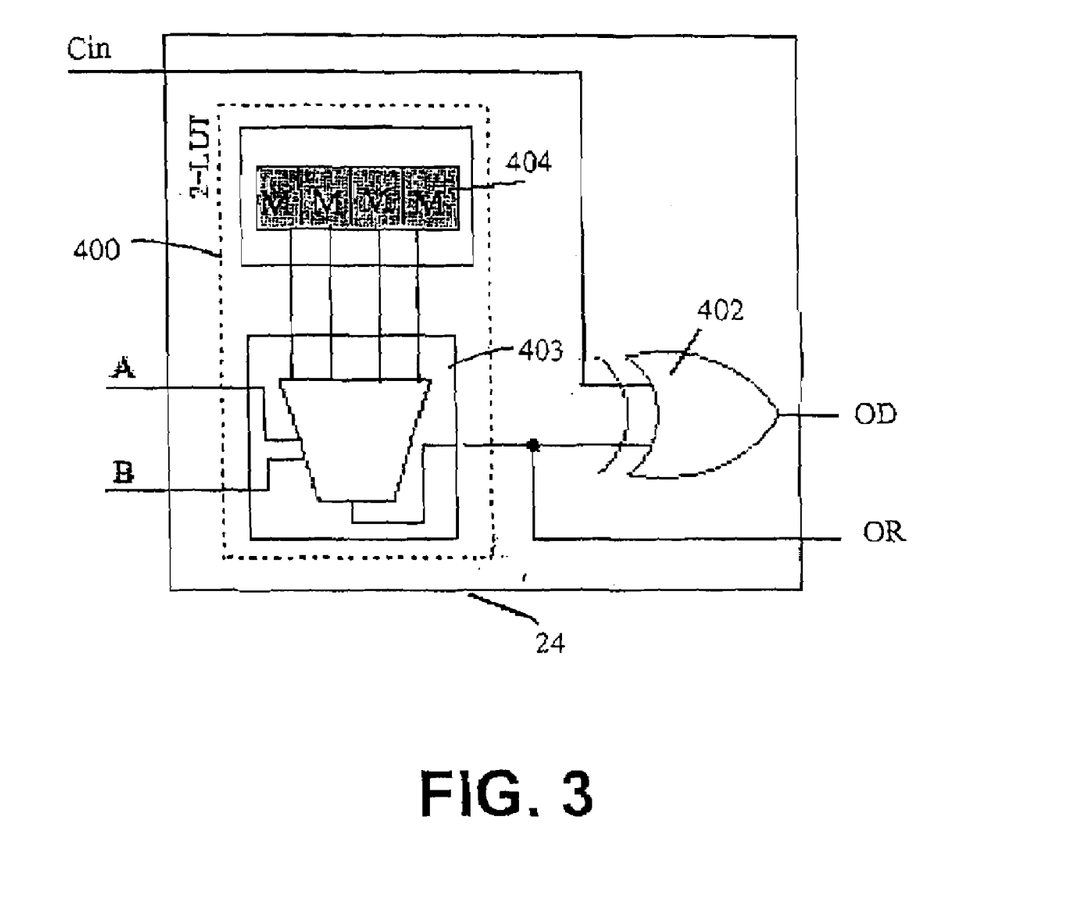
FIG. 3 shows a programmable logic unit according to an embodiment of the invention.

FIG. 3 shows an embodiment of a programmable logic unit 24 according to the present invention. The programmable logic unit 24 contains a LUT unit 400 and an exclusive OR gate 402. The LUT unit 400 comprises selection logic 403, for example a 4:1 multiplexer, and a configuration memory 404. The signal inputs A, B of programmable logic unit 24 are coupled to the inputs of the selection logic 403 of the LUT unit 400. An output of LUT unit 400 is coupled to an input of exclusive-OR gate 402. A second input of first exclusive OR-gate 402 is coupled to receive a carry input signal Cin from the carry chain 28, and an output of the exclusive OR gate 402 forms an output signal OD.

In operation in the multi-bit operand processing mode, the LUT unit 400 realizes a configurable input output function. In response to each possible combination of input signals A, B, the LUT unit 400 outputs a respective output signal that is selected by the input signals. Each combination of input signals has an output signal assigned to it by configuration bits that are stored in configuration memory 404. For the 2-bit LUT 400 used in this example, four configuration bits are sufficient to store one configuration bit for each possible combination of input bits. Through the action of exclusive OR gate 402, the output signal of the LUT unit 400 is output from the XOR gate 402 when the carry input signal is logic low, while the output signal is output inverted from XOR gate 402 if the carry input signal is logic high.

The output signal OD is therefore available when the programming logic unit 24 is handling datapath functions. The programmable logic unit 24 is also able to handle random logic functions.

According to the invention, in addition to the output signal OD, a separate output signal OR is provided from the programmable logic unit 24, the second output signal OR being provided directly from the output of the LUT 400. The output signal OR provides an enhanced random logic mode of operation, since the dependence on the carry signal is removed. Thus, in addition to the datapath output signal OD available via the output of the XOR gate 402, a random logic signal OR is also made available. The random logic signal reduces the delay of the logic cell in the random logic mode.

Figure 4:
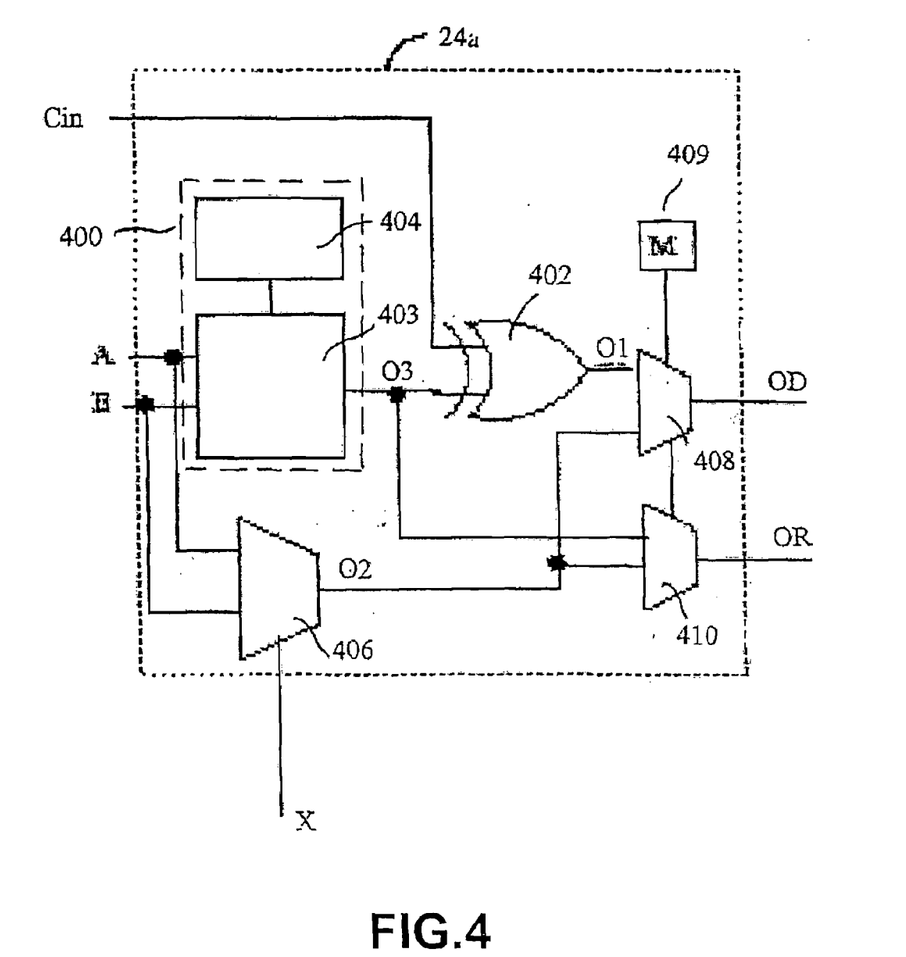
FIG. 4 shows a programmable logic unit of the invention when used with multiplexer mapping.

FIG. 4 shows an alternative embodiment of the programmable logic unit 24. In the embodiment of FIG. 4, the LUT unit 400 (comprising the selection logic 403 and configuration memory 404), and the XOR gate 402 have the same functions as the corresponding features of the unit shown in FIG. 3. The XOR gate 402 produces an output signal O1, while the LUT 400 produces an output signal O3. Additionally, each programmable logic unit 24 is adapted to handle multiplexing functions, by having a multiplexer 406 in parallel with the LUT 400. The multiplexer 406 is controlled by a signal X, which is an auxiliary signal of the logic cell. The multiplexer 406 produces an output signal O2 under the control of signal X. This means that the programmable logic unit has available a first output O1 (being the output for datapath functions having carry dependency), a second output O2 (being the multiplexer output), and a third output O3 (being the random logic output, which by-passes the XOR 402).

Preferably, first and second auxiliary multiplexers 408, 410 are provided to reduce the number of output signals from the programmable logic unit 24, although these may be omitted if desired. The first auxiliary multiplexer 408 selects between the output signal O2 from the multiplexer 406 and the output signal O1 from the XOR gate 402. The second auxiliary multiplexer 410 selects between the output signal O2 from the multiplexer 406 and the output signal O3 from the LUT 400. The first and second auxiliary multiplexers 408, 410 are controlled by a configuration bit 409. As described with reference to FIG. 3, this arrangement improves the performance of the logic cell when configured to work in the random logic mode, since a direct LUT output O3 is utilized, which removes the dependency on the carry signal when operating in the random logic mode, since the effect of the carry signal on the XOR gate 402 does not influence the random logic output O3.

Figure 5:
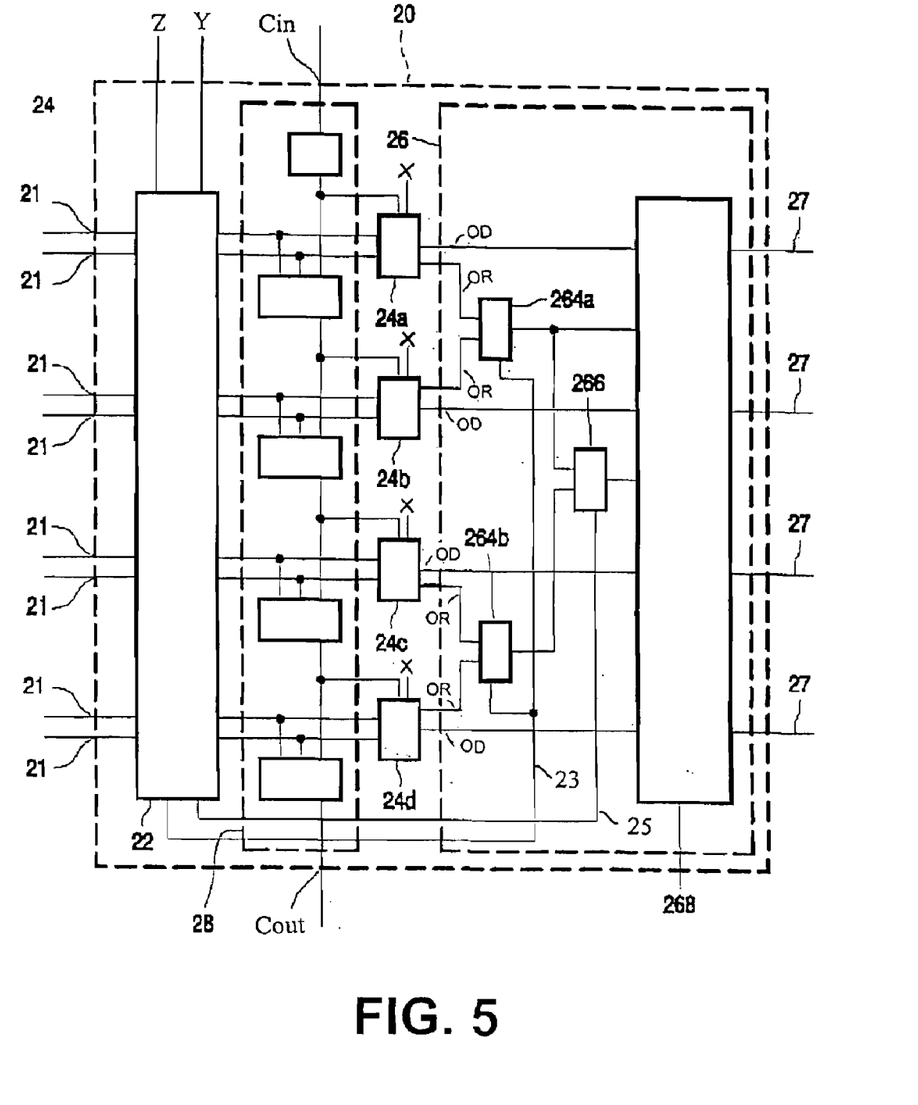
FIG. 5 shows a programmable logic cell having a programmable logic unit as shown in FIGS. 3 or 4.

FIG. 5 shows a programmable logic cell having programmable logic units 24a–d according to FIGS. 3 or 4. Each programmable logic unit 24a–d has first and second output signals OD, OR connected to the output circuit 26. The output signals OD for use in the datapath mode are connected directly to the output switching circuit 268, while the output signals OR for use in the random logic mode are connected to the first stage of multiplexers 264a, 264b.

With the programmable logic units of FIGS. 3 or 4, an arithmetic addition operation may be implemented by programming the configuration bits of LUT unit 400 to perform an exclusive OR function. Operations other than addition may be implemented by programming LUT unit 400 differently and, of course, addition of a first and second operand is equivalent to subtraction of the complement of the second operand from the first operand, when a logic high carry input signal is used at the lowest significance level.

Figure 6:
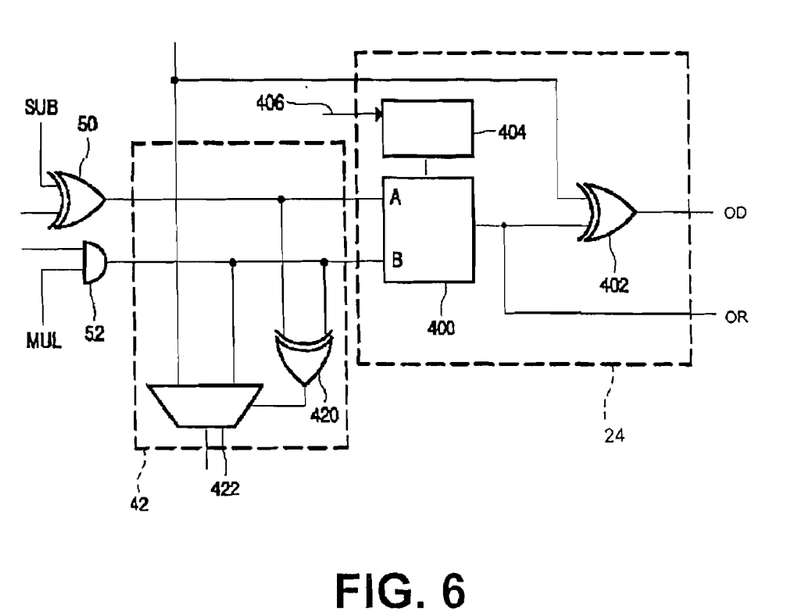
FIG. 6 shows further details of the carry chain with the programmable logic unit of FIG. 3.

FIG. 6 shows the programmable logic unit of FIG. 3 and a part 42 of the carry chain 28. As mentioned previously, programmable logic unit 24 contains a LUT 400, a configuration memory 404 and a first exclusive OR gate 402. The part of the carry chain 42 contains a second exclusive OR gate 420 and a multiplexer 422. The signal inputs A, B of programmable logic unit 24 are coupled to inputs of the second exclusive OR gate 420, which has an output coupled to a control input of multiplexer 422. Multiplexer 422 has inputs coupled to the carry input and to one of the signal inputs of the programmable logic unit 24, respectively. The carry output signal is determined from the carry input signal and the input signals A, B of the programmable logic unit 24. When the input signals are equal (i.e. the output of XOR gate 420 is logic low), multiplexer 422 outputs one of the input signals, for example B, as carry output signal. When the input signals A, B are not equal (i.e. the output of XOR gate 420 is logic high), the multiplexer 422 outputs the carry input signal as carry output signal. As an alternative to the above, since LUT unit 400 in the datapath mode implements an XOR gate, the dedicated XOR gate 420 may be removed and the selection signal for the multiplexer 422 provided by the output of the LUT unit 400.

Additional gates 50, 52 enable the programmable logic unit 24 to perform arithmetic subtraction without external complement formation and 1-bit multiplication-plus-accumulation (e.g. as a step in multi-bit multiplication). Implementation of subtraction is facilitated by adding an exclusive OR gate 50 between on one side the LUT unit and second exclusive OR gate and on the other side one of the signal inputs A, B that receives a bit of the operand that must be subtracted. A subtraction control signal SUB is supplied to one of the inputs of exclusive OR gate 50 so that the input signal is logically inverted. The subtraction control signal is set to zero when addition is required. A common subtraction control signal for all of the programmable logic units in cell 20 may be used for this purpose. The subtraction signal may be controlled by a configuration bit of cell 20 or by a signal from outside cell 20. In case of subtraction a logic high carry input signal is applied to the programmable logic unit that is associated with the lowest significance level.

Implementation of multiplication plus accumulation is supported by adding an AND gate 52 between on one side the LUT unit and second exclusive OR gate and on the other side one of the signal inputs A, B that receives a bit of the operand that must be multiplied and supplying a factor signal to one of the inputs of this AND gate. A common factor signal for all of the programmable logic units in cell 20 may be used for this purpose. The factor signal MUL is set to one when addition is required.

It is noted that, although FIG. 6 shows AND gate 52 and the exclusive OR gate 50 provided in combination, it will be readily apparent to a person skilled in the art that either may be omitted when no subtraction or multiplication is required. Also, it will be understood that multiplication and subtraction can be implemented in alternative ways, with equivalents of exclusive OR gate 50 at different positions in the circuit and/or a different configuration of LUT unit 400. For example, exclusive OR gate 50 may be coupled between an output of the input circuit and the input of carry chain 42, the output of the input circuit being coupled to programmable logic unit 40 without passing through exclusive OR gate 50, provided that the configuration bits in programmable logic unit 40 are adapted to the absence of the effect of exclusive OR gate 50 in case of subtraction. In this case, however, the configuration of programmable logic unit needs to be changed when one switches from addition to subtraction.

Figure 7:
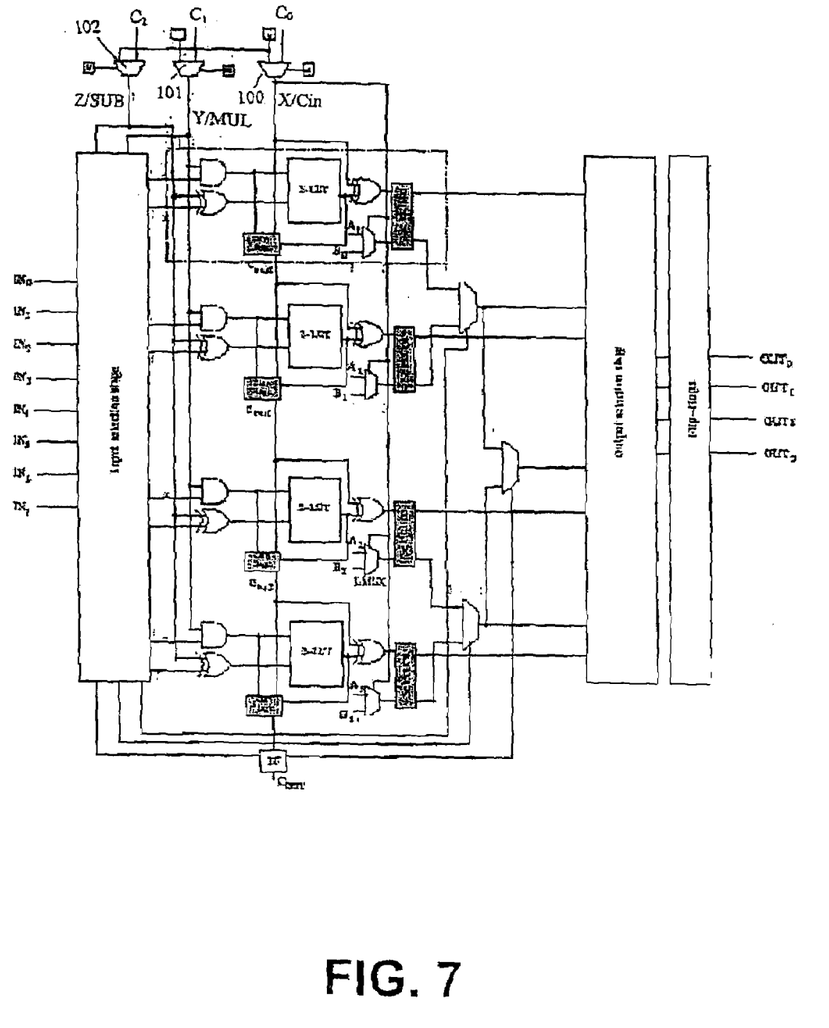
FIG. 7 shows an implementation of the logic cell having pin sharing.

It is also noted that the control signals Cin, MUL and SUB can share the same control lines as the X, Y and Z control signals used for controlling the multiplexers 406, 264a, 264b and 266. FIG. 7 shows an example implementation showing how the control signals X/Cin, Y/MUL and Z/SUB can be shared in this manner. This arrangement has the further advantage of reducing the number of input pins required.

Figure 8:
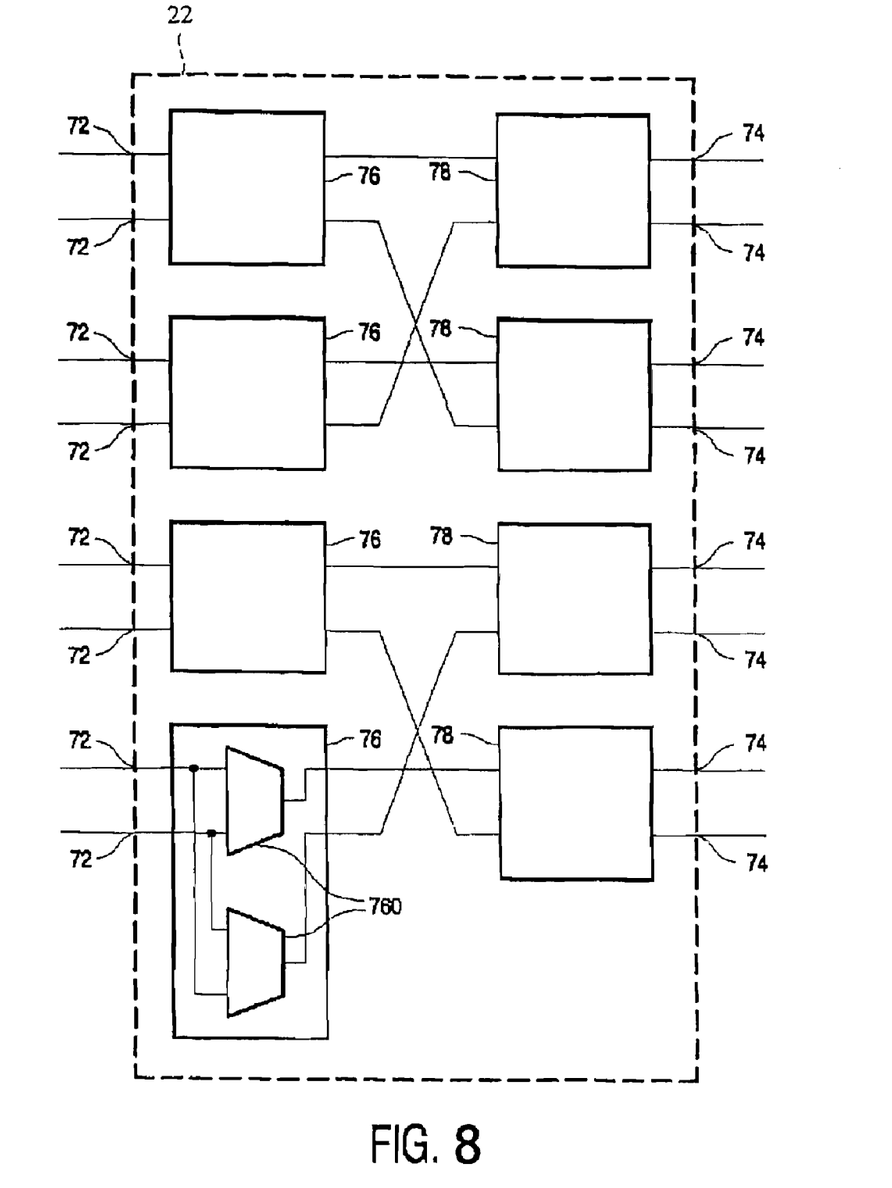
FIG. 8 shows an input circuit.

FIG. 8 shows an input circuit 22. Input circuit 22 has a plurality of inputs 72 coupled to inputs of cell 20 and a plurality of outputs 74 coupled to the inputs of programmable logic units 24a–d and to multiplexers in the output circuit of cell 20. The inputs 72 and outputs 74 are coupled via two layers of switching circuits 76, 78. The switching circuits may be implemented using two multiplexers 760 in each switching circuit 76, 78 (only one shown in detail), each multiplexer 760 providing a configurable coupling between from each input of the switching circuit to a respective one of the outputs. Input circuit 22 also contains third multiplexers (not shown) for selecting input signals that are fed to the multiplexers 264a,b, 266 of the output stage. The operation of switching circuits 76, 78, and the third multiplexers is controlled by configuration bits from configuration memories (not shown).

Both layers 76, 78 are organized as groups of switching circuits 76, 78 each coupling a respective pairs of that inputs to a respective pair of outputs, and are arranged so that the switching circuits 76, 78 in each group are capable of configurably switching between on one hand copying signals from each one of the pair of inputs to both outputs of its pair of outputs, and on the other hand coupling the signals from each input of the pair of inputs to respective ones of the pair of outputs. Layers 76, 78 are combined in series, with outputs from pairs of switching circuits 76 of the first layer being coupled cross-wise to inputs of a pair of different switching circuit 78 in the second layer 78. As a result layers 76, 78 couple quadruplets of inputs 72 to respective quadruplets of outputs 74, and are capable of configurably switching between copying signals from each one of the quadruplet of inputs 72 to all of the outputs in the corresponding quadruplets of outputs 74, and coupling respective ones of the quadruplet of inputs to respective ones of the quadruplet of outputs.

Cell 20 has configuration memories (not shown) coupled to control inputs of switching circuits 76, 78, so that the content of the configuration memories controls switching of the multiplexers of the input circuit. The configuration memories at least select between a random logic mode and a multi-bit operand mode. In the random logic mode switching circuits 76, 78, are controlled to copy signals from two of inputs 72 are copied to inputs of each of the programmable logic units and the third multiplexers (not shown) are controlled to couple signals from other ones of the inputs to control inputs of multiplexers in the output circuit. In the multi-bit operand mode switching circuits 76, 78, are controlled to couple respective ones of inputs 72 to respective ones of outputs 74. In principle, memory for one configuration bit suffices to select between these two modes, but preferably memory for additional configuration bits is provided that select which of the inputs are copied to all of the programmable logic units in the random logic mode. In the latter case, five configuration bits may be used: one configuration bit for selecting between the multi-bit operand mode (one to one signal transfer) and the random logic mode (four times copying) and two times two configuration bits, each for selecting one of four of inputs that is coupled to inputs of each of the programmable logic units.

The third multiplexers (not shown) select the inputs from which signals are fed to the control inputs of the stages of the multiplexers in output circuit 26. Preferably, two third multiplexers are provided, each for selecting an input signal for controlling a respective stage of output circuit 26.

In principle the signal inputs of the cell may be organized into groups of (e.g. four) signal inputs in which each signal input of a group supplies a respective bit of a multi-bit operand that corresponds to the group. To support a random logic mode and a multi-bit operand mode it suffices that the cell has a configuration bit that selects between passing input signals from pairs of groups of logic inputs, each programmable logic unit receiving signals from both groups in the pair, and passing copies of a set of inputs to all programmable logic units. Additional configuration bits may be provided to select the groups or the set.

In this context, a cell with four programmable logic units is especially advantageous, because the number of input signals of random logic functions and the number of bits in multi-bit operands is the same in this case. This means that each group that corresponds to an operand can also be selected as a set of inputs for a random logic function. The configuration bits, if any, for selecting the groups in the multi-bit operand modes may be used to select a group in the random logic mode. In this case a single additional configuration bit suffices for use in the random logic mode, to select which of the groups that would be used as operands in the multi-bit operand mode will be used as set of inputs for the random logic function.

It will be appreciated that many variations are possible in cell 20 that enable a similar configurability. For example, cells with larger number of two bit input programmable logic units 24*a–d* may be used, for example with eight such units and with a multiplexer that selects the output of one of these eight programmable logic units under control of three input signals. Thus, 8 bit multi-bit signal processing operations may be used for example.

The invention described above provides a logic cell which is configurable between random logic functions and datapath functions, and which provides an enhanced random logic mode of operation that does not rely on a carry signal.

The invention claimed is:

1. An electronic circuit with an array of programmable logic cells, each of the cells comprising:
   an input circuit with a plurality of logic inputs;
   an output circuit;
   a plurality of programmable logic units, coupled in parallel between the input circuit and the output circuit, the logic cell being configurable between a random logic mode and a multi-bit operand processing mode;
   wherein at least one of the programmable logic units comprises:
   a configurable look-up table circuit, having inputs coupled to receive the logic input signals from the input circuit and having an output;
   a controllable inverter/non-inverter circuit, having an input connected to the output of the look-up table circuit, and being controllable by an input carry signal;
   a first output node connected to receive the output of the inverter/non-inverter circuit, and coupled to the output circuit for providing a multi-bit operand processing mode output signal; and
   a second output node connected to receive the output of the look-up table circuit, for providing a random logic mode output signal.

2. An electronic circuit as claimed in claim 1, further comprising a carry input and a carry output, a carry chain coupled between the carry input, the input circuit and the carry output;
   the programmable logic units being coupled to successive positions along the carry chain at least in the multi-bit operand processing mode, so as to process carry signals from the carry chain, the output circuit selecting an output signal from the programmable logic units under control of further input signals in the random logic mode and passing outputs from the programmable logic units in parallel in the multi-bit operand processing mode.

3. An electronic circuit as claimed in claim 2, wherein a carry input signal received by the programmable logic unit is coupled to an inversion non-inversion control input of the inverter/non-inverter circuit.

4. An electronic circuit as claimed in claim 1, the programmable logic unit further comprising:
   a multiplexer, having inputs coupled to receive the logic input signals from the input circuit and having an output, the multiplexer receiving a control signal for determining which of the input signals is passed to the output of the multiplexer.

5. An electronic circuit as claimed in claim 4, wherein the programmable logic unit further comprises an auxiliary multiplexer having inputs coupled to receive the output of the inverter/non-inverter circuit and the output of the multiplexer, and the auxiliary multiplexer having an output connected to the first output node of the programmable logic unit.

6. An electronic circuit as claimed in claim 5, wherein the auxiliary multiplexer receives a control signal for selecting whether the output of the inverter/non-inverter circuit or the output of the multiplexer is passed to the first output node of the programmable logic unit.

7. As electronic circuit as claimed in claim 6, wherein the control signal is provided in configuration information in a configuration memory.

8. An electronic circuit as claimed in claim 4, wherein the programmable logic unit comprises:
   a first auxiliary multiplexer having inputs coupled to receive the output of the inverter/non-inverter circuit and the output of the multiplexer, the output of the first auxiliary multiplexer being connected to the first output node;
   a second auxiliary multiplexer having inputs coupled to receive the output of the look-up table circuit and the output of the multiplexer, the output of the second auxiliary multiplexer being connected to the second output node;
   wherein the first and second auxiliary multiplexers provide output signals in accordance with configuration information.

9. An electronic circuit as claimed in claim 1, wherein the output circuit comprises a first stage of multiplexers for receiving the random logic mode output signals of the programmable logic units.

10. An electronic circuit as claimed in claim 9, wherein the output circuit comprises at least one further stage of multiplexing, the at least one further stage of multiplexing comprising at least one multiplexer configurable to receive the outputs of the multiplexers in the first stage of multiplexers, for providing a random logic output signal to an input of an output switching circuit.

11. An electronic circuit according to claim 2, wherein the cell comprises a subtraction control circuit arranged to control at least a carry output determination operation of the carry chain, the carry chain determining a carry output signal from input signals and carry input signals at each position along the carry chain, control by the subtraction control circuit switching the carry output determination at least between a determination appropriate for addition and determination appropriate for subtraction, under control of a subtraction control signal.

12. An electronic circuit according to claim 2, wherein the cell comprises a respective multiplication circuit for each programmable logic unit, coupled to multiply at least one of the inputs signals of the programmable logic unit with a multiplicand prior to supplying said at least one of the input signals to an input of the programmable logic unit.

13. An electronic circuit according to claim 2, wherein the carry chain circuit has a configurable coupling between said positions and a the carry input of the cell, for configurably supplying either a carry input signal to the carry chain or a standard signal, under control of configuration information from a configuration memory.

14. An electronic circuit according to claim 2, wherein the carry chain circuit has a plurality of configurable couplings, each coupled between a respective one of said positions and a respective one of the programmable logic units, for configurably supplying either a carry signal from said position to the programmable logic circuit or a further signal that is not a result of propagation through the carry chain, under control of configuration information from a configuration memory.

15. An electronic circuit according to claim 1, wherein each of the programmable logic units has two unit inputs for signals from the logic inputs, each programmable logic unit being configurable to implement independently any two-input bit logic function of the logic inputs.

16. An electronic circuit according to claim 1, wherein the controllable inverter/non-inverter circuit comprises an exclusive OR circuit having a first input coupled to the output of the look-up table circuit, and a second input coupled to the carry input.

17. An electronic circuit according to claim 1, wherein the input circuit is arranged to be configurable to provide only a proper subset of all possible couplings between the signal inputs of the cell and inputs of the programmable logic units, the subset comprising a multi-bit operand coupling, in which respective ones of the signal inputs are coupled to respective inputs of respective ones of the programmable logic units, and a random logic coupling in which a subset of the signal inputs is coupled to the inputs of each of the programmable logic units.

18. An electronic circuit according to claim 17, wherein the subset comprises a two-bit output random logic coupling in which a first and second subset of the signal inputs are coupled to the inputs of each of a first and second subset of pluralities of the programmable logic units respectively.

19. An electronic circuit according to claim 1, configured to perform a random logic function, wherein each of the programmable logic units is configured to provide a respective input-output relation and logic input signals from the logic inputs select from which of the programmable logic units a logic output signal is passed to a logic output of the output circuit.

20. An electronic circuit according to claim 1, configured to perform a multi-bit operand signal processing function, wherein each of the programmable logic units is configured to provide the same input-output relation subject to a carry input signal from the carry chain, and the output circuits outputs output signals from the programmable logic units in parallel.

21. An electronic circuit according to claim 1, configured to perform a multiplexing function, wherein each of the programmable logic units is configured to pass one of its input signals to an output, and to invert that one of the input signals during said passing when a multiplexer control signal that is common to the programmable logic units is asserted and the input signals of the programmable logic unit are mutually different.

* * * * *